US006090660A

United States Patent [19]
Noble, Jr.

[11] Patent Number: 6,090,660
[45] Date of Patent: *Jul. 18, 2000

[54] METHOD OF FABRICATING A GATE CONNECTOR

[75] Inventor: Wendell P. Noble, Jr., Milton, Vt.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/544,498

[22] Filed: Oct. 18, 1995

Related U.S. Application Data

[62] Division of application No. 08/365,617, Dec. 28, 1994.

[51] Int. Cl.[7] .................................................. H01L 21/8242
[52] U.S. Cl. ...................... 438/243; 438/238; 438/239; 438/386; 257/301; 257/296
[58] Field of Search .................................. 437/47, 48, 52, 437/60, 919; 438/238, 239, 243–289, 386–392, 622, 625, 947; 257/301, 296

[56] References Cited

U.S. PATENT DOCUMENTS

| | | | |
|---|---|---|---|
| 4,801,988 | 1/1989 | Kenney | 357/23.6 |
| 4,953,125 | 8/1990 | Okumura et al. | 365/149 |
| 5,013,680 | 5/1991 | Lowrey et al. | 437/52 |
| 5,160,987 | 11/1992 | Pricer et al. | 257/307 |
| 5,202,272 | 4/1993 | Hsieh et al. | 437/29 |
| 5,214,603 | 5/1993 | Dhong et al. | 365/207 |
| 5,264,716 | 11/1993 | Kenney | 257/301 |
| 5,369,049 | 11/1994 | Acocella et al. | 437/52 |
| 5,384,277 | 1/1995 | Hsu et al. | 437/52 |

FOREIGN PATENT DOCUMENTS

0526790A2  10/1993  European Pat. Off. .

OTHER PUBLICATIONS

"Silicon Processing for the VLSI Era vol. 1—Process Technology," S. Wolf and R.N. Tauber, Lattice Press, pp. 1–6, 1986.

"Webster's II New Riverside University Dictionary," The Riverside Publishing Company, p. 1052, 1984.

Patent Abstracts of Japan vol. 13 No. 496 (E–843) (3844) Nov. 1989 & JP–A–01 199465 (Oct. 8, 1989).

*Primary Examiner*—Matthew Smith
*Assistant Examiner*—Granvill D Lee
*Attorney, Agent, or Firm*—James M. Leas

[57] ABSTRACT

The present invention is a DRAM cell, comprising a transistor having a gate, the gate having an individual segment of gate conductor and a conductive spacer rail wordline in contact with the segment gate. The wordline connector is formed by directional etching a conductor formed along a sidewall above the gate segment. The sidewall is formed by etching a groove in a mandrel. The structure permits design of a five square folded-bitline DRAM cell.

23 Claims, 4 Drawing Sheets

METHOD OF FABRICATING A GATE CONNECTOR

This is a divisional of copending application Ser. No. 8/365,617 filed on Dec. 28, 1994.

FIELD OF THE INVENTION

This invention generally relates to DRAM cell design and semiconductor interconnection techniques. More particularly, it relates to a conductive sidewall rail wordline for a DRAM cell and to a cell design with significantly diminished dimensions.

BACKGROUND OF THE INVENTION

Large numbers of DRAM cells must be interconnected with wordlines, and wordlines and spaces between wordlines are determinative of the size of a folded-bitline cell. Typically, wordlines are formed as thin films of a conductor, such as aluminum or polysilicon, deposited on insulating materials on the semiconductor surface and defined as lines photolithographically. Efforts to shrink wordlines and the spaces between wordlines are limited since both line widths and spaces cannot practically be made smaller than the minimum photolithographically defined line. While it is possible to decrease the line width, for example, decreasing the line width usually increases the line-to-line spacing and so the overall wordline pitch is not improved. The cost of decreasing the photolithographic minimum dimension is high, and each such effort has defined succeeding generations of semiconductor products. In each generation of DRAM cells, the photolithographically defined wordline and its associated space have each thus been formed at the photolithographic minimum dimension.

In the folded-bitline DRAM cell design, both an active and a passing word line pass through each cell, as illustrated in commonly assigned U.S. Pat. No. 4,801,988 ("the '988 patent"), issued to D. M. Kenney, entitled "Semiconductor Trench Capacitor Cell with Merged Isolation and Node Trench Construction," and shown here in FIG. 1. Crossing over trench capacitors 505A and 510A for a pair of cells in FIG. 1, are wordlines 515A and 520A. The space required for such a DRAM cell is a minimum dimension for each of the two wordlines in each cell and an additional minimum dimension for each space between each wordline. Thus the total minimum length of the traditional cell is 4 minimum dimensions. The width of the cell is at least two minimum dimensions, of which one is for the components in the cell and the other is for a thick isolation (a trench capacitor can be a part of this isolation) in the space between cells. Thus, the minimum area of a traditional cell has been 8 square minimum dimensions, or 8 squares.

One approach to avoid the photolithographic limit is to provide a wordline formed of a conductive sidewall rail. The width of such rails is determined by the thickness of the deposited conductor, and this thickness can be significantly less than a minimum photolithographic dimension. Commonly assigned U.S. Pat. No. 5,202,272 ("the '272 patent"), issued to Hsieh, entitled "Field Effect Transistor Formed With Deep-Submicron Gate," and U.S. Pat. No. 5,013,680 ("the '680 patent"), issued to Lowrey, entitled "Process for Fabricating a DRAM Array Having Feature Widths that Transcend the Resolution Limit of Available Photolithography," teach methods of using a subminimum dimension conductive sidewall spacer rail to form a wordline.

One problem encountered in the use of such subminimum dimension spacer rail wordlines is the difficulty of precisely controlling the length of the device and the extent of lateral diffusion of the source and drain. For example, small variations of spacer thickness or lateral diffusion can result in a large variation in the length of the subminimum dimension channel. The result can be large leakage currents on the one hand and degraded performance on the other. The present invention avoids the difficulties of the subminimum dimension sidewall spacer rail wordlines of the prior art.

SUMMARY OF THE INVENTION

It is, therefore, an object of the present invention to provide a folded-bitline DRAM cell with a photolithographically formed gate, the cell having an area of less than 8 squares.

It is a feature of the present invention that a subminimum dimension spacer rail wordline links approximately minimum dimension individual gate segments.

It is a further object of the present invention to provide a transistor with an individual segment gate conductor and a subminimum dimension spacer rail gate connector.

These and other objects of the invention are accomplished by semiconductor structure comprising a transistor having a gate comprising an individual segment of gate conductor that is substantially coextensive with the thin dielectric of the gate stack. A connector is in contact with the segment gate, the connector being a conductive spacer rail.

Another aspect of the invention involves a DRAM cell comprising a transistor having a gate comprising an individual segment of gate conductor that is substantially coextensive with the thin dielectric of the gate stack. A wordline is in contact with the segment gate, the wordline being a conductive spacer rail.

Applicant recognized that, in a folded-bitline arrangement, the use of a subminimum dimension spacer rail wordline permits saving 1½ minimum dimensions along the long direction of the cell, reducing this length from 4 minimum dimensions to 2½ minimum dimensions, thereby reducing the area of the DRAM cell from 8 squares to 5 squares, a 37.5% reduction in cell area. In addition, because the gate function and the strapping function of the wordline are separated in the present invention, the advantages of a polysilicon gate can be retained while high conductivity materials, such as tungsten or aluminum can be used to form the subminimum dimension wordlines, retaining high conductivity for the wordlines as well.

Another aspect of the invention is accomplished by a method comprising the steps of forming a gate of a transistor comprising an individual segment of gate conductor; forming a mandrel having a sidewall over the gate conductor; forming a conductive material adjacent the sidewall and in contact with the gate conductor; and directional etching the conductive material to form a spacer rail connector.

These and other objects, features, and advantages of the invention will become apparent from the drawings and description of the invention.

BRIEF DESCRIPTION OF THE DRAWINGS

The foregoing and other objects, features, and advantages of the invention will be apparent from the following detailed description of the invention, as illustrated in the accompanying drawings, in which.

DESCRIPTION OF THE INVENTION

The present invention, illustrated in FIGS. 2–7, provides a DRAM cell having a gate formed from an individual segment of gate conductor that has a length and width of about one minimum dimension (within overlay tolerances). A wordline interconnecting such segment gates and the space between wordlines each have a subminimum dimension as a result of the wordline being formed by a directional etch of a conductor along a sidewall. The structure allows design of a DRAM array with a folded-bitline architecture in which cells have an area of 5–8 squares.

The folded-bitline DRAM array is one example of an array of transistors for which the present invention is applicable. The invention allows a folded-bitline DRAM array having dimensions of 2.5 by 2 minimum dimensions, or an area of 5 squares.

The term "horizontal" as used in this application is defined as a plane parallel to the conventional planar surface of a semiconductor chip or wafer, regardless of the orientation the chip is actually held. The term "vertical" refers to a direction perpendicular to the horizontal as defined above. Prepositions, such as "on," "side," (as in "sidewall"), "higher," "lower," "over," and "under" are defined with respect to the conventional planar surface being on the top surface of the chip or wafer, regardless of the orientation the chip is actually held.

Single crystal semiconducting wafers used in the process steps illustrated in FIGS. 2–6 are formed from materials such as silicon, germanium, and gallium arsenide. Because silicon is most widely used and the most is known about its etch properties, silicon will be used for illustration hereinbelow. The wafer may have had implants, diffusions, oxidations, and other process steps completed before embarking on the process sequences described hereinbelow.

FIGS. 2–6 show steps in the process of fabricating a DRAM cell of the present invention. The initial process steps in the manufacture of the invention are illustrated in FIGS. 3 through 10 of commonly assigned U.S. Pat. No. 5,264,716 ("the '716 patent"), issued to D. M. Kenney, entitled "Diffused Buried Plate Trench Dram Cell Array," incorporated herein by reference. In the '716 patent, however, a whole wordline is defined by a masking step. In the present invention, individual rectangular or square gate stack segments (instead of whole wordlines) are defined by that masking step, each segment having only a single gate for a single transistor. Preferably the gate segments have dimensions of about one minimum dimension in each direction along the planar surface (or little more to accommodate overlay tolerances) and the gates are aligned to fill the minimum dimension space between trench capacitors.

Figure 1:
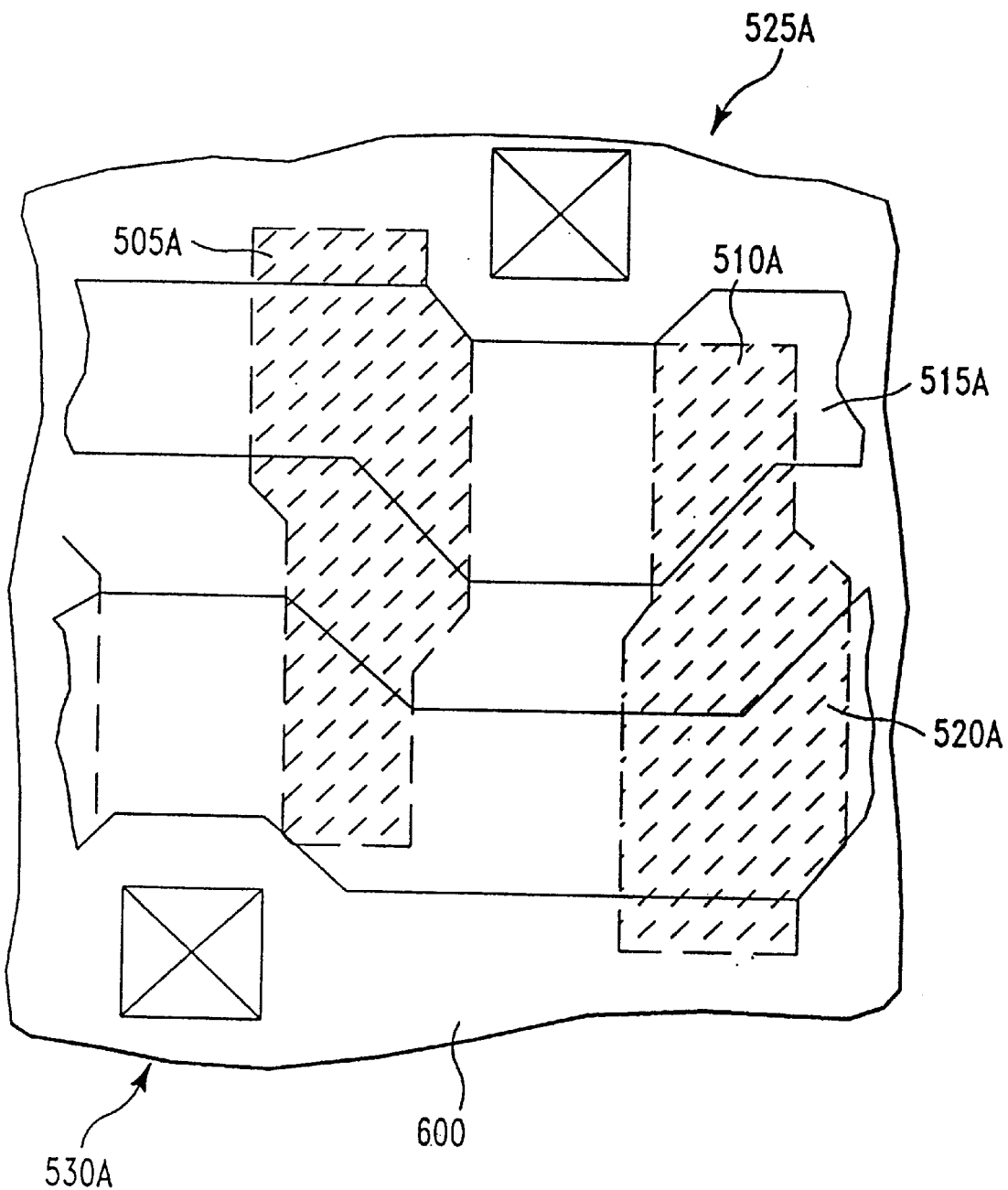
FIG. 1 is a top view showing the layout of a pair of prior art DRAM cells.
Figure 2:
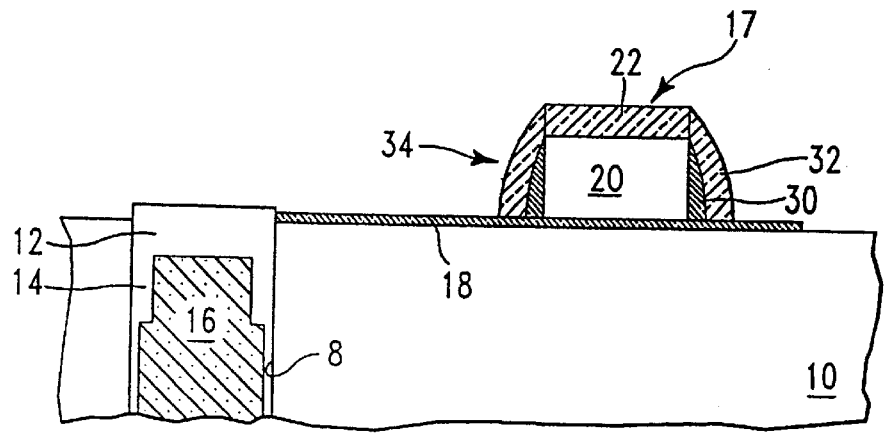
FIGS. 2–6 are cross-sectional views showing steps in the process for making a DRAM cell in accordance with the invention.

Referring now to FIG. 2, deep trench 8 in silicon substrate 10 is formed with trench cap oxide 12, trench collar 14, and trench polysilicon 16. Gate stack 17 comprises gate dielectric 18, polysilicon gate segment 20, and nitride cap 22. Oxide spacer 30 is thermally grown or deposited and directionally etched. Then nitride sidewall spacer 32 is deposited and directionally etched. Thus, in the present invention, gate segment 20 has spacers 30 and 32 on all four sides. Some misalignment of gate stack 17 and trench 8 is acceptable since the spacers are added to the dimensions of the gate segment. In addition, in the photolithographic step to form deep trenches, typically the trenches are formed slightly larger than the mask minimum dimension so the spaces between trenches are correspondingly smaller than the minimum dimension. Thus, the full extent of the distance between deep trenches will be covered by gate stack 17 and its spacers 30 and 32 even though the gate stack itself has a minimum dimension width (or little more than a minimum dimension). This full coverage is important to avoid shorting between source and drain in a later ion implant step to form the source/drain diffusions.

Figure 3:
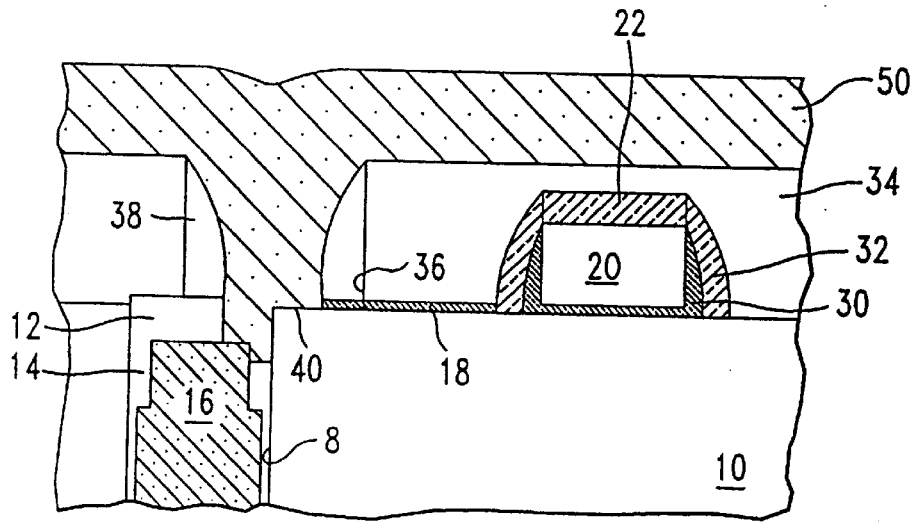

In the next step, illustrated in FIG. 3, intrinsic polysilicon mandrel 34 is deposited and planarized. A minimum image mask is then used to define and etch hole 36 through intrinsic polysilicon mandrel 34 for the node strap. This silicon etch stops on gate dielectric 18 and trench cap oxide 12. A second intrinsic polysilicon layer is then deposited and directionally etched, leaving spacer collar 38 along the sidewall of hole 36 in mandrel 34. Thus, the size of hole 36 in mandrel 34 is reduced by the subminimum dimension of spacer collar 38. Then, exposed portions of trench cap oxide 12, trench collar 14, and gate dielectric 18 are etched to expose the surfaces of trench polysilicon 16 and region 40 that will become the node diffusion of the transistor. Doped polysilicon 50 is then deposited, filling hole 36, and providing strap 52 (see FIG. 4) electrically connecting trench polysilicon 16 and region 40 that will become the node diffusion of the transistor.

Figure 4:
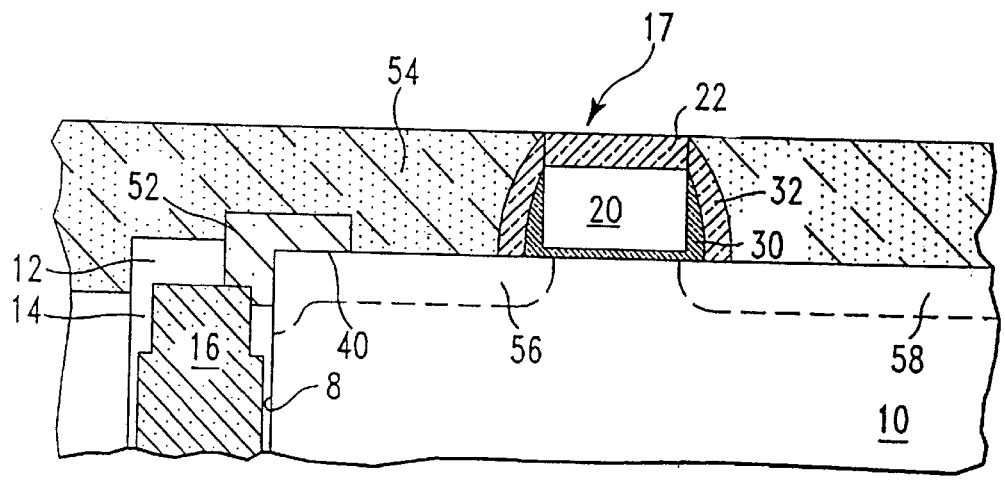

Next, doped polysilicon 50 is recess etched so that strap 52 is at a level below nitride cap 22. Referring now to FIG. 4, intrinsic polysilicon mandrel 34 and intrinsic polysilicon spacer collar 38 are then removed by a selective etch that leaves heavily doped polysilicon 50 virtually intact. Several selective etchants are available, including KOH and alcohol, ethylene diamine and pyrocatechol, or gallic acid etchant as described in U.S. Pat. No. 5,160,987 issued to C. W. D. Pricer, et al., incorporated herein by reference. Thus, undoped portions of polysilicon are removed and doped portions remain. Doped oxide 54 is then deposited having a thickness greater than the height of gate 20 and gate nitride cap 22. Oxide 54 is arsenic doped for an n-channel array and boron doped for a p-channel array. Doped oxide 54 is then polished back stopping on gate nitride cap 22. For forming transistors in areas of the chip outside the DRAM array a block mask can be used to remove doped glass 54. Conventional source/drain implants are then performed in these non-array areas. The anneal and drive-in steps for the implants also diffuse dopant from doped oxide 54 and polysilicon strap 52 into substrate 10 to provide node diffusion 56 and bitline diffusion 58 of transistor 59.

Figure 5:
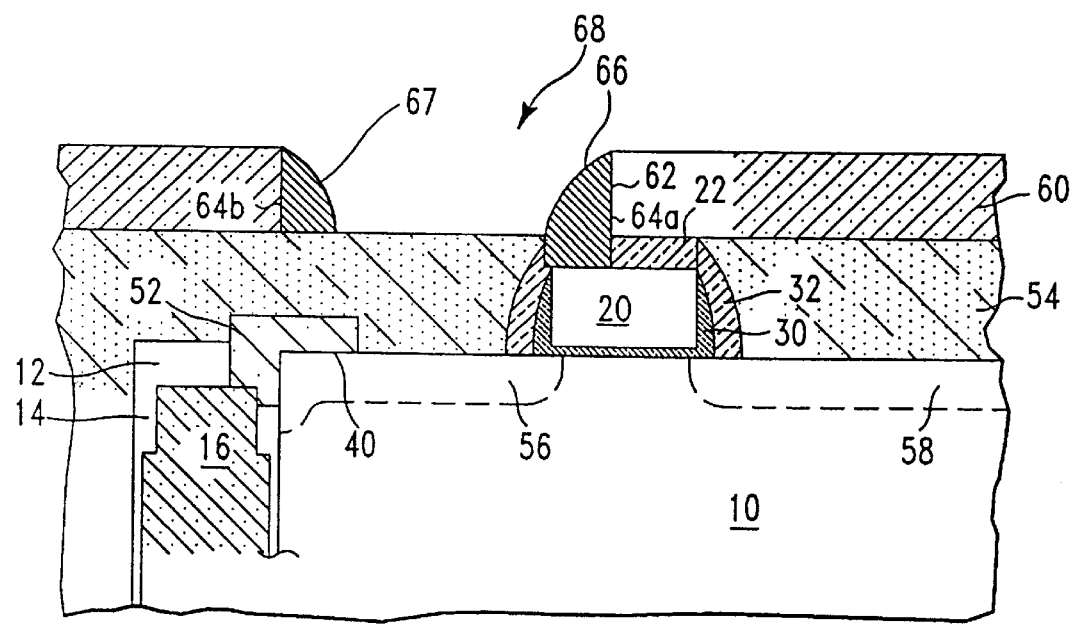

As shown in FIG. 5, thick intrinsic polysilicon mandrel 60 is then deposited, planarized, and patterned using a mask. The pattern provides minimum dimension groove 62 in polysilicon mandrel 60 having sidewall 64a extending over gate nitride 22 and gate polysilicon 20. Groove 62 and sidewalls 64a and 64b extend over the gates of many cells of the array. A directional etch is then performed to remove the portion of nitride 22 from gate polysilicon 20 that is exposed within groove 62. In the next step, a conductor is deposited and directional etched leaving subminimum dimension conductive spacer rail 66 contacting gate polysilicon 20 along sidewall 64a. The etch also leaves subminimum dimension conductive spacer rail 67 along sidewall 64b. Associated space 68 between adjacent wordline connectors 66 and 67 is also formed by this etch and it also has a subminimum dimension. Rails 66 and 67 provide wordlines interconnecting gate segments of the array. In the cell illustrated in FIG. 5, rail 66 is an active wordline (in this cell rail 66 contacts a gate segment) and rail 67 is a passing wordline (in this cell rail 67 does not contact a gate segment).

Figure 6:
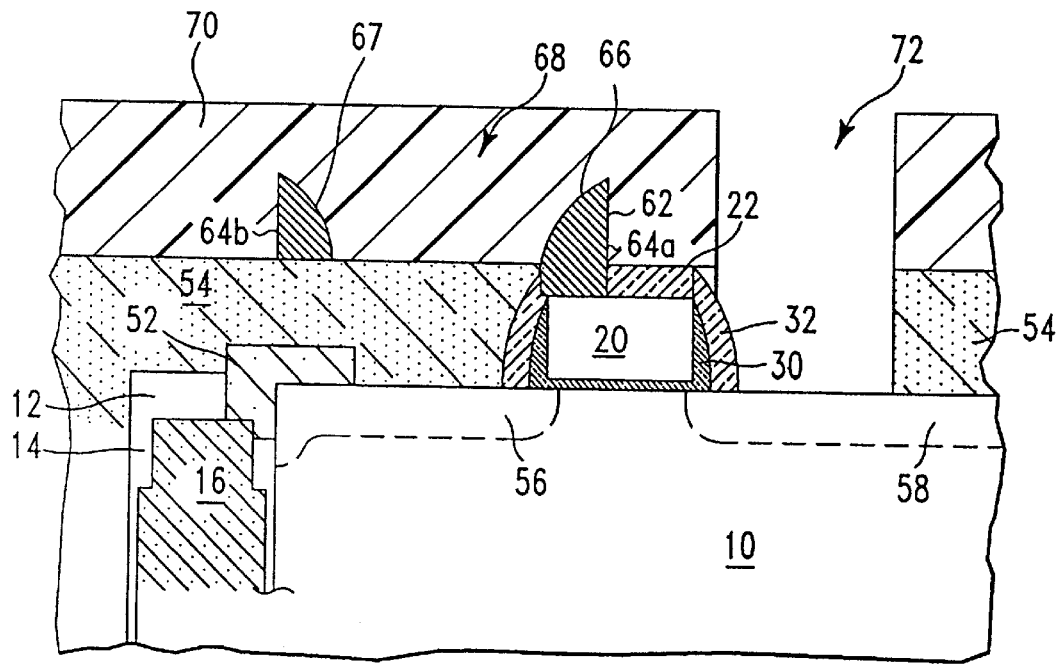

In the next step, a block mask is used along with an etch to remove portions of rails 66 and 67 where they connect at edges of the array, so as to disconnect these adjacent rails from each other. Intrinsic polysilicon mandrel 60 is then stripped. As shown in FIG. 6, interlevel dielectric 70 is then deposited and standard back end of the line processing continues. For example, borderless bit line contact 72 is etched in interlevel dielectric 70 using a mask aligned to rail 66. Significant alignment tolerance is acceptable for the wordlines as long as edge 64 of groove 62 extends over a portion of gate poly 20 (FIG. 5).

Conductive rail 66 is formed of a low resistivity material such as a metal or a metal silicide. Metals such as tungsten, molybdenum, titanium, or aluminum, are suitable. The low resistivity material can be deposited by methods known in the art, such as chemical vapor deposition. It can also be formed from heavily doped polysilicon. Conductive rail 66 is then formed from the deposited conductor by a directional etch. The directional etch removes portions of the material on horizontal surfaces before substantially removing portions along vertical walls.

Figure 7:
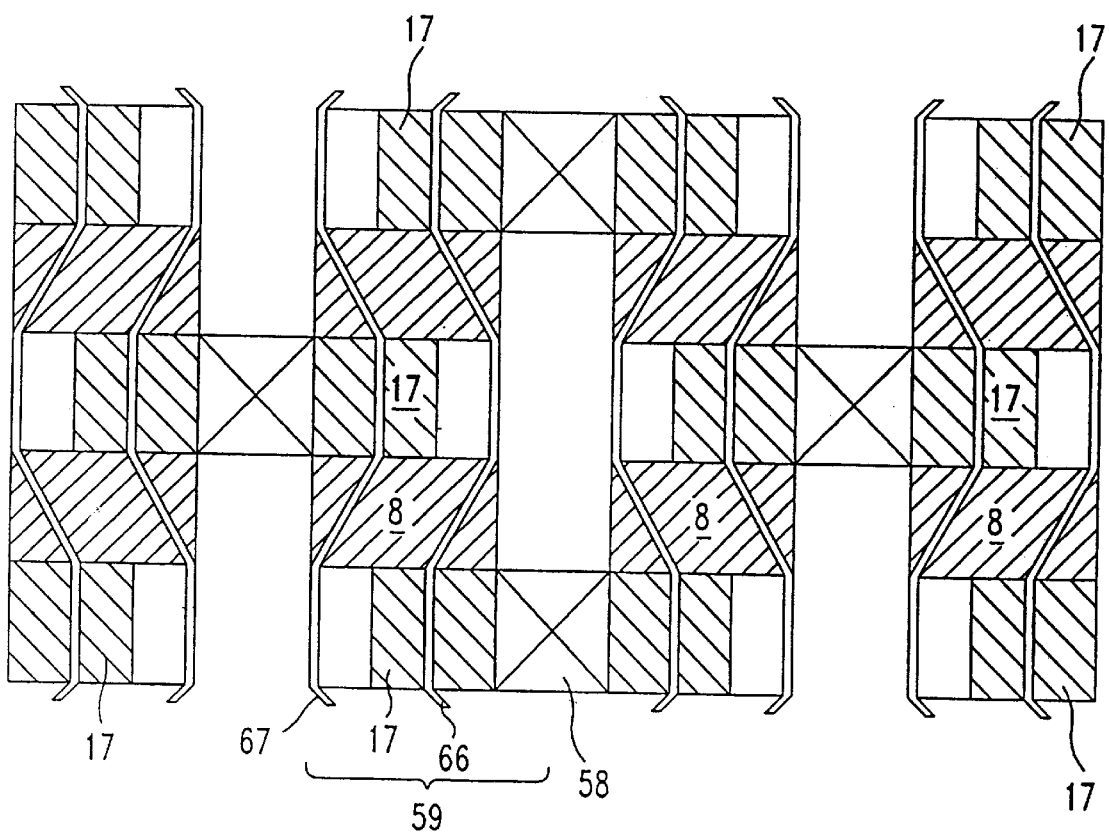
FIG. 7 is a top view showing the layout of a DRAM cell and a portion of an array in accordance with the present invention.

Referring now to FIG. 7, the cell layout includes transistor 59 having gate stack 17, active word line 66 contacting gate stack 17, passing word line 67 contacting a gate stack in an adjacent cell, trench capacitor 8, and bitline diffusion 58 which is shared with an adjacent cell.

While several embodiments of the invention, together with modifications thereof, have been described in detail herein and illustrated in the accompanying drawings, it will be evident that various further modifications are possible without departing from the scope of the invention. For example, a wide range of materials can be used for mandrels 34, 38, and 60 and for rail 66. While the invention appears to be most suitable for a folded-bitline architecture as described above, other architectures, such as an open bitline architecture can be used. The invention can be practiced with n- or p-channel transistors with corresponding changes in the doping of the polysilicon strap and node polysilicon. Nothing in the above specification is intended to limit the invention more narrowly than the appended claims. The examples given are intended only to be illustrative rather than exclusive.

What is claimed is:

1. A method of making a semiconductor structure, comprising the steps of:
   (a) forming a device having a gate, said gate consisting of an individual segment of gate conductor on a thin gate dielectric, said device further comprising a single crystal semiconductor substrate, said gate not over any trench capacitor; and
   (b) forming a connector on top of and electrically contacting said segment gate conductor, said connector being a conductive spacer rail extending beyond said device.

2. A method as recited in claim 1, wherein said conductive spacer rail connector is a wordline and the semiconductor structure is a DRAM cell.

3. A method as recited in claim 2, further comprising a first associated space adjacent said wordline spacer rail connector.

4. A method as recited in claim 3, wherein said first associated space is subminimum dimension.

5. A method as recited in claim 1, wherein said individual segment of gate conductor has a length and a width each equal to about one minimum dimension.

6. A method as recited in claim 1, wherein said step (b) comprises the step of forming a mandrel and etching a groove in said mandrel, said groove having a sidewall over said gate conductor.

7. A method as recited in claim 6, wherein said mandrel is formed of intrinsic polysilicon.

8. A method as recited in claim 1, wherein in said step (a) said gate conductor is substantially co-extensive with said thin dielectric.

9. A method as recited in claim 1, wherein in said forming step (a) forming a trench capacitor in said semiconductor a substrate, said trench capacitor adjacent said gate.

10. A method of forming a semiconductor structure, comprising the steps of:
    (a) forming a transistor having a gate, said gate consisting of an individual segment of gate conductor on a thin gate dielectric, said transistor further comprising a channel located between two diffusions under said gate, said channel consisting of a single crystal semiconductor substrate; and
    (b) forming a connector on top of and electrically contacting said segment gate conductor, said connector being a conductive spacer rail.

11. A method as recited in claim 10, wherein in said connector forming step (b) said conducive spacer rail has a width equal to less than one minimum dimension.

12. A method as recited in claim 10, wherein in said forming step (a) forming a trench capacitor in said semiconductor a substrate, said trench capacitor adjacent said gate, said gate not over any said trench capacitor.

13. A method of forming a DRAM cell, comprising the steps of:
    (a) forming a transistor comprising a gate, said gate comprising an individual segment of gate conductor on a thin dielectric, said transistor further comprising a channel located between two diffusions under said gate, said channel consisting of a single crystal semiconductor substrate; and
    (b) forming a word line on top of and electrically contacting said segment gate conductor, said word line being a conductive spacer rail.

14. A method as recited in claim 13, wherein in said connector forming step (b) said conductive spacer rail has a width equal to less than one minimum dimension.

15. A method as recited in claim 13, further comprising the step of forming a passing wordline, said passing wordline being a second conductive spacer rail, there being distance between said wordline and said passing wordline, said distance being less than one minimum dimension.

16. A method as recited in claim 13, further comprising the step of forming a trench having a capacitor therein, wherein said individual segment of gate conductor is adjacent to said trench, said wordline and said passing wordline extending over said trench.

17. A method as recited in claim 13, wherein in said forming step (a) forming a trench capacitor in said semiconductor a substrate, said trench capacitor adjacent said gate, said gate not over any said trench capacitor.

18. A method of forming a semiconductor structure, comprising the steps of:
    (a) forming a first device having a gate on a substrate, said gate comprising an individual segment of gate conductor on a thin dielectric, said thin dielectric on said substrate, said gate not over any trench capacitor;
    (b) forming a second device having a second gate on said substrate; and
    (c) forming a connector on top of and electrically contacting said segment gate conductor, said connector being a conductive spacer rail, said conductive spacer rail extending beyond said segment gate conductor, said conductive spacer rail extending to said second gate.

19. A method as recited in claim 18, wherein in said connector forming step (b) said conductive spacer rail has a width equal to less than one minimum dimension.

20. A method as recited in claim 18, wherein in said forming step (a) forming a trench capacitor in said semiconductor a substrate, said trench capacitor adjacent said gate.

21. A method of forming a semiconductor structure, comprising the steps of:

(a) forming a gate electrode on a semiconductor substrate, said gate electrode comprising a thin dielectric and an individual segment of gate conductor, said gate conductor being substantially co-extensive with said thin dielectric, said gate conductor having a top surface having opposed first and second edges and opposed third and fourth edges, wherein said substrate comprises a single crystal semiconductor, wherein said substrate under said gate is not over any trench capacitor;

(b) forming a thick isolation on said substrate bounding said first and second edges, said thick isolation having a lateral dimension of at least a minimum dimension;

(c) forming a source self-aligned to said third edge and a drain self-aligned to said fourth edge, said thick isolation not bounding said third edge and said fourth edge; and (d) forming a conductive wiring level in contact with said top surface.

22. A method as recited in claim 21, wherein in said conductive wiring level forming step (d) said conductive wiring has a width equal to less than one minimum dimension.

23. A method as recited in claim 21, wherein in said forming step (a) forming a trench capacitor in said semiconductor a substrate, said trench capacitor adjacent said gate.

* * * * *